United States Patent
Xu

(10) Patent No.: US 11,495,621 B2
(45) Date of Patent: Nov. 8, 2022

(54) ARRAY SUBSTRATE, DISPLAY PANEL, AND METHOD OF MANUFACTURING THE ARRAY SUBSTRATE

(71) Applicant: Wuhan China Star Optoelectronics Semiconductor Display Technology Co., Ltd., Wuhan (CN)

(72) Inventor: Zuzhao Xu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/630,473

(22) PCT Filed: Aug. 16, 2019

(86) PCT No.: PCT/CN2019/101169
§ 371 (c)(1),
(2) Date: Jan. 13, 2020

(87) PCT Pub. No.: WO2020/258465
PCT Pub. Date: Dec. 30, 2020

(65) Prior Publication Data
US 2022/0181358 A1   Jun. 9, 2022

(30) Foreign Application Priority Data
Jun. 26, 2019   (CN) .......................... 201910561199.8

(51) Int. Cl.
*H01L 33/44* (2010.01)
*H01L 27/12* (2006.01)

(52) U.S. Cl.
CPC ...... *H01L 27/1222* (2013.01); *H01L 27/1262* (2013.01); *H01L 27/1288* (2013.01)

(58) Field of Classification Search
CPC ............. H01L 27/1222; H01L 27/1262; H01L 27/1288; H01L 25/048; H01L 25/167;
(Continued)

(56) References Cited

U.S. PATENT DOCUMENTS

2005/0218794 A1   10/2005   Seo et al.
2017/0110531 A1    4/2017   Ko et al.
(Continued)

FOREIGN PATENT DOCUMENTS

CN   107546247 A   1/2018
CN   109166880 A   1/2019
(Continued)

*Primary Examiner* — Samuel Park
(74) *Attorney, Agent, or Firm* — Nathan & Associates; Menachem Nathan

(57) ABSTRACT

The disclosure relates to an array substrate, a display panel, and a method of manufacturing the array substrate. The array substrate includes a substrate, and a non-organic membrane layer, a first organic layer, and a source/drain electrode layer which are sequentially disposed on the substrate. The substrate includes a display region. A first opening and a second opening are defined in the non-organic membrane layer and defined in the display region. The first organic layer fills the first opening. A thickness of the first organic layer is not greater than a depth of the first opening. The first organic layer does not fill the second opening. The source/drain electrode layer covers an inner wall of the second opening.

14 Claims, 3 Drawing Sheets

(58) Field of Classification Search
CPC ....... H01L 27/15; H01L 27/288; H01L 27/32; H01L 51/0032; H01L 51/05
See application file for complete search history.

(56) References Cited

U.S. PATENT DOCUMENTS

| | | | |
|---|---|---|---|
| 2019/0157618 A1* | 5/2019 | Park | H01L 51/5253 |
| 2019/0295475 A1* | 9/2019 | Lee | G09G 3/3291 |
| 2020/0168671 A1* | 5/2020 | Jang | G06F 3/04164 |
| 2020/0243574 A1* | 7/2020 | Tian | H01L 27/1248 |
| 2021/0327987 A1* | 10/2021 | Fang | H01L 27/3276 |

FOREIGN PATENT DOCUMENTS

| | | | |
|---|---|---|---|
| CN | 109494313 A | | 3/2019 |
| KR | 20180148162 A | * | 11/2018 |

* cited by examiner

ARRAY SUBSTRATE, DISPLAY PANEL, AND METHOD OF MANUFACTURING THE ARRAY SUBSTRATE

FILED

The present disclosure relates to a field of display panel technology and, more particularly, relates to an array substrate, a display panel, and a method of manufacturing the array substrate.

BACKGROUND

Active-matrix organic light-emitting diodes (AMOLEDs) are gradually becoming a next-generation display technology because of their characteristics such as high contrast, wide color gamut, low power consumption, and flexibility.

Currently, in process of manufacturing an array substrate of a flexible AMOLED panel, there is a vital step to realize a flexible panel: defining openings on non-organic layers, which endure large forces and have bad flexibility, on a display region by an etching process, and then forming an organic layer to fill the openings. As a result, flexibility of the display region can be improved.

However, the organic layer formed in the above step of realizing a flexible panel will enlarge height differences between layers, resulting in a too-thin source/drain electrode layer or even breakage of wires in a later process of manufacturing the source/drain electrode layer.

SUMMARY

The present disclosure provides an array substrate, a display panel, and a method of manufacturing the array substrate to avoid a problem of a too-thin source/drain electrode layer or even breakage of wires which are caused by too-large height differences between layers.

To solve the above problem, an embodiment of the present disclosure provides an array substrate. The array substrate includes a substrate including a display region; a non-organic membrane layer disposed on the substrate, wherein a first opening and a second opening are defined in the non-organic membrane layer and are defined in the display region; a first organic layer disposed on the non-organic membrane layer, wherein the first organic layer fills the first opening, a thickness of the first organic layer is not greater than a depth of the first opening, and the first organic layer does not fill the second opening; and a source/drain electrode layer disposed on the first organic layer, wherein the source/drain electrode layer covers an inner wall of the second opening.

Here, the non-organic membrane layer includes a buffer layer, a first gate insulating layer, a second gate insulating layer, and an interlayer dielectric layer which are sequentially away from the substrate. The second opening extends and passes through the first gate insulating layer, the second gate insulating layer, and the interlayer dielectric layer.

Here, the array substrate further includes a low-temperature polysilicon layer, a first metal layer, and a second metal layer. The low-temperature polysilicon layer is disposed between the buffer layer and the first gate insulating layer. The first metal layer is disposed between the first gate insulating layer and second gate insulating layer. The second metal layer is disposed between the second gate insulating layer and the interlayer dielectric layer. The source/drain electrode layer is connected to the low-temperature polysilicon layer by the second opening. A projected area of the first opening on the substrate does not overlap a projected area of the low-temperature polysilicon layer on the substrate, a projected area of the first metal layer on the substrate, and a projected area of the second metal layer on the substrate.

Here, the depth of the first opening is equal to a thickness of the non-organic membrane layer.

Here, the number of the first opening is greater than one, and the first openings are evenly distributed on the display region.

Here, the substrate further includes a non-display region disposed surrounding a periphery of the display region. The array substrate further includes a second organic layer disposed on a same layer as the first organic layer. The second organic layer is disposed on the non-display region, and the thickness of the first organic layer is less than a thickness of the second organic layer.

Here, a ratio of the thickness of the first organic layer to the thickness of the second organic layer ranges from 0.3 to 0.7.

Here, a third opening is further defined in the non-organic membrane layer and is defined in the non-display region. The second organic layer fills the third opening.

To solve the above problem, an embodiment of the present disclosure further provides a method of manufacturing an array substrate. The method of manufacturing an array substrate includes a plurality of steps of: providing a substrate including a display region; forming a non-organic membrane layer on the substrate; forming a first opening and a second opening on the non-organic membrane layer, wherein the first opening and a second opening are defined in the display region; forming a first organic layer on the non-organic membrane layer, wherein the first organic layer fills the first opening, a thickness of the first organic layer is not larger than a depth of the first opening, and the first organic layer does not fill the second opening; and forming a source/drain electrode layer on the first organic layer, wherein the source/drain electrode layer covers an inner wall of the second opening.

Here, the non-organic membrane layer includes a buffer layer, a first gate insulating layer, a second gate insulating layer, and an interlayer dielectric layer which are sequentially away from the substrate. The step of forming a non-organic layer on the substrate includes a plurality of steps of: depositing the buffer on the substrate; depositing the first gate insulating layer on the buffer layer; depositing the second gate insulating on the first gate insulating layer; and depositing the interlayer dielectric layer on the second gate electrode layer.

Here, the substrate further includes a non-display region disposed surrounding a periphery of the display region. The array substrate further includes a second organic layer disposed on a same layer as the first organic layer. The second organic layer is disposed on the non-display region. The step of forming a first organic layer on the non-organic membrane layer includes a plurality of steps of: providing a mask, wherein the mask includes a shading region and semi-transmissive region; precisely aligning the mask with the non-organic membrane layer; forming a second organic layer on the non-organic membrane layer corresponding to the shading region; and forming a first organic layer on the non-organic membrane layer corresponding to the semi-transmissive region, wherein a thickness of the first organic layer is less than a thickness of the second organic layer.

To solve the above problem, an embodiment of the present disclosure provides a display panel. The display panel includes an array substrate. The array substrate includes a substrate including a display region; a non-organic membrane layer disposed on the substrate, wherein a first opening and a second opening are defined in the non-organic membrane layer and are defined in the display region; a first organic layer disposed on the non-organic membrane layer, wherein the first organic layer fills the first opening, a thickness of the first organic layer is not greater than a depth of the first opening, and the first organic layer does not fill the second opening; and a source/drain electrode layer disposed on the first organic layer, wherein the source/drain electrode layer covers an inner wall of the second opening.

Here, the non-organic membrane layer includes a buffer layer, a first gate insulating layer, a second gate insulating layer, and an interlayer dielectric layer which are sequentially away from the substrate. The second opening extends and passes through the first gate insulating layer, the second gate insulating layer, and the interlayer dielectric layer.

Here, the array substrate further includes a low-temperature polysilicon layer, a first metal layer, and a second metal layer. The low-temperature polysilicon layer is disposed between the buffer layer and the first gate insulating layer. The first metal layer is disposed between the first gate insulating layer and second gate insulating layer. The second metal layer is disposed between the second gate insulating layer and the interlayer dielectric layer. The source/drain electrode layer is connected to the low-temperature polysilicon layer by the second opening. A projected area of the first opening on the substrate does not overlap a projected area of the low-temperature polysilicon layer on the substrate, a projected area of the first metal layer on the substrate, and a projected area of the second metal layer on the substrate.

Here, the depth of the first opening is equal to a thickness of the non-organic membrane layer.

Here, the number of the first opening is greater than one, and the first openings are evenly distributed on the display region.

Here, the substrate further includes a non-display region disposed surrounding a periphery of the display region. The array substrate further includes a second organic layer disposed on a same layer as the first organic layer. The second organic layer is disposed on the non-display region, and the thickness of the first organic layer is less than a thickness of the second organic layer.

Here, a ratio of the thickness of the first organic layer to the thickness of the second organic layer ranges from 0.3 to 0.7.

Here, a third opening is further defined in the non-organic membrane layer and is defined in the non-display region. The second organic layer fills the third opening.

Regarding beneficial effects of the present disclosure: the present disclosure provides an array substrate including a substrate, and a non-organic membrane layer, a first organic layer, and a source/drain electrode layer which are sequentially disposed on the substrate. The substrate includes a display region. A first opening and a second opening are defined in the non-organic membrane layer and are defined in the display region. A first organic layer fills the first opening. A thickness of the first organic layer is not larger than a depth of the first opening. The first organic layer does not fill the second opening. The source/drain electrode layer covers an inner wall of the second opening. By reducing the thickness of the first organic layer, height differences of layers at the second opening are reduced. Therefore, a problem of a too-thin source/drain electrode layer or even breakage of wires which are caused by too-large height differences between layers is avoided, and production yield is improved.

DESCRIPTION OF DRAWINGS

The accompanying figures to be used in the description of embodiments of the present disclosure or prior art will be described in brief to more clearly illustrate the technical solutions of the embodiments or the prior art. Apparently, the accompanying figures described below are only part of the embodiments of the present disclosure, from which figures those skilled in the art can derive further figures without making any inventive efforts.

DETAILED DESCRIPTION

The embodiments of the present disclosure are described in detail hereinafter. Examples of the described embodiments are given in the accompanying drawings. It should be noted, the specific embodiments described with reference to the attached drawings are all exemplary and are intended to illustrate and interpret the present disclosure, which shall not be construed as causing limitations to the present disclosure.

Currently, an organic layer formed in a step of realizing a flexible AMOLED panel will enlarge height differences between layers, resulting in a too-thin source/drain electrode layer or even breakage of wires in a later process of manufacturing the source/drain electrode layer. To solve the above technical problem, the present disclosure provides an array substrate to avoid a problem of a too-thin source/drain electrode layer or even breakage of wires which are caused by too-large height differences between layers.

Figure 1:
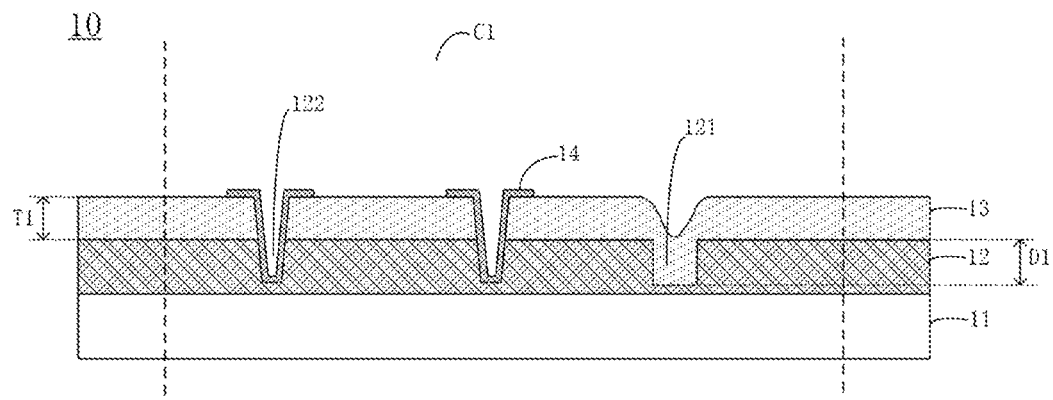
FIG. 1 is a schematic structural view of an array substrate provided by an embodiment of the present disclosure.

Referring to FIG. 1, FIG. 1 is a schematic structural view of an array substrate provided by an embodiment of the present disclosure. As shown in FIG. 1, the array substrate 10 includes a substrate 11, and a non-organic membrane layer 12, a first organic layer 13, and a source/drain electrode layer 14 which are sequentially disposed on the substrate 11. The substrate 11 includes a display region C1. The non-organic membrane layer 12 includes a first opening 121 and a second opening 122. The first opening 121 and a second opening 122 are defined in the display region C1. The first organic layer 13 fills the first opening 121. A thickness T1 of the first organic layer 13 is not greater than a depth D1 of the first opening 121. The first organic layer 13 does not fill the second opening 122. The source/drain electrode layer 14 covers an inner wall of the second opening 122.

In the present embodiment, because the thickness T1 of the first organic layer 13 is not greater than the depth D1 of the first opening 121, not only can the array substrate 10 be flexible, but height differences, which are caused by an arrangement of the first organic layer 13, of layers near the second opening 122 can be reduced. As a result, a problem of a too-thin source/drain electrode layer 14 which covers an inner wall of the second opening 122 or even breakage of wires can be avoided.

The substrate 11 is a flexible substrate. Material of the substrate 11 is an organic polymer and may be one of polyimide, polycarbonate, polyethylene terephthalate, or polyethersulfone. Material of the first organic layer 13 is an organic insulating material and may be polyimide resin, epoxy resin, or acrylic resin. Material of the source/drain electrode layer 14 is a metal and may be Al, Cu, or Ag.

Figure 2:
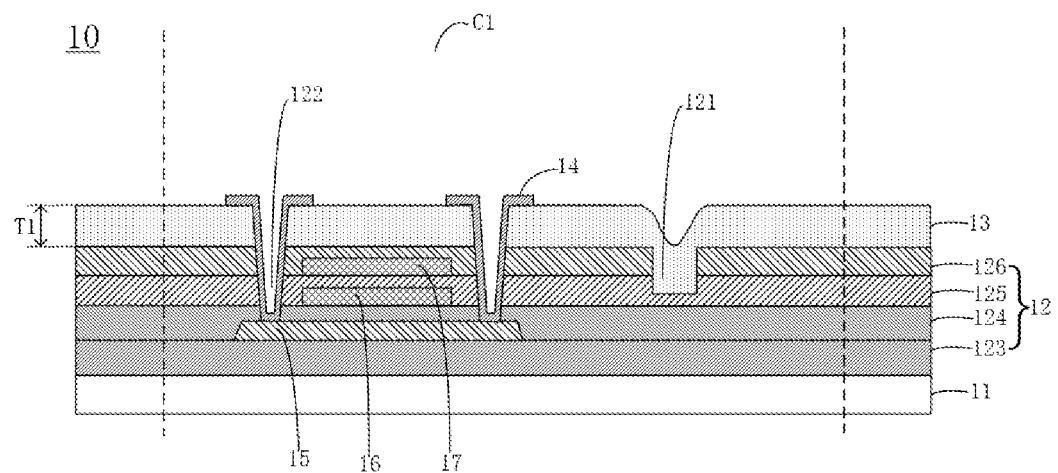
FIG. 2 is another schematic structural view of an array substrate provided by an embodiment of the present disclosure.

Specifically, as shown in FIG. 2, the non-organic membrane layer 12 may includes a buffer layer 123, a first gate insulating layer 124, a second gate insulating layer 125, and an interlayer dielectric layer 126 which are sequentially away from the substrate 11. The second opening 122 extends and passes through the first gate insulating layer 124, the second gate insulating layer 125, and the interlayer dielectric layer 126.

Material of the buffer layer 123 may be SiNx, SiOx, or other appropriate material. Material of the first gate insulating layer 124 may be SiOx. Material of the second gate insulating layer 125 may be SiNx. Material of the interlayer dielectric layer 126 may be SiNx and/or SiOx.

Keeping referring to FIG. 2, the array substrate 10 may further include a low-temperature polysilicon layer 15, a first metal layer 16, and a second metal layer 17 which are sequentially away from the substrate 11. The low-temperature polysilicon layer 15, the first metal layer 16, and the second metal layer 17 are disposed on the display region C1. The low-temperature polysilicon layer 15 is disposed between the buffer layer 123 and the first gate insulating layer 124. The first metal layer 16 is disposed between the first gate insulating layer 124 and the second gate insulating layer 125. The second metal layer 17 is disposed between the second gate insulating layer 125 and the interlayer dielectric layer 126.

Specifically, the low-temperature polysilicon layer 15 may be an active layer of a thin film transistor of the array substrate 10. The source/drain electrode layer 14 is connected to the low-temperature polysilicon layer 15 by the second opening 122. The first metal layer 16 may be a patterned gate electrode layer including a gate electrode of the thin film transistor of the array substrate 10 and a lower electrode of a storage capacitor. The second metal electrode 17 may include an upper electrode of the storage capacitor. The upper electrode and the lower electrode form the storage capacitor of the array substrate 10.

In the present embodiment, a projected of the first opening 121 on the substrate 11 does not overlap a projected area of the low-temperature polysilicon layer 15, a projected area of the first metal layer 16 on the substrate 11, and a projected area of the second metal layer 17 on the substrate 11. That is, the thin film transistor of the array substrate 10 will not be harmed during process of defining the first opening 121 on the non-organic membrane layer 12.

Specifically, flexibility of organic material is better than that of non-organic material. Consequently, by defining the first opening 121 in the non-organic membrane 12 and forming the first organic layer 13 on the non-organic membrane 12 to fill the first opening 121, bending forces applied to the display region C1 can be reduced, and flexibility of the display region C1 can be further improved.

The amount of the first opening 121 may be multiple, thereby further improving flexibility of the display region C1 effectively. Moreover, the first openings 121 may be evenly distributed in the display region C1, thereby ensuring that the display panel can display uniformly.

In some embodiments, the depth D1 of the first opening 121 may be equal to a thickness of the non-organic membrane layer 12. That is, the first opening 121 may extend through the buffer layer 123, the first gate insulating layer 124, the second gate insulating layer 125, and the interlayer dielectric layer 126. As a result, bending forces applied to the display region of the array substrate can be further reduced effectively.

Figure 3:
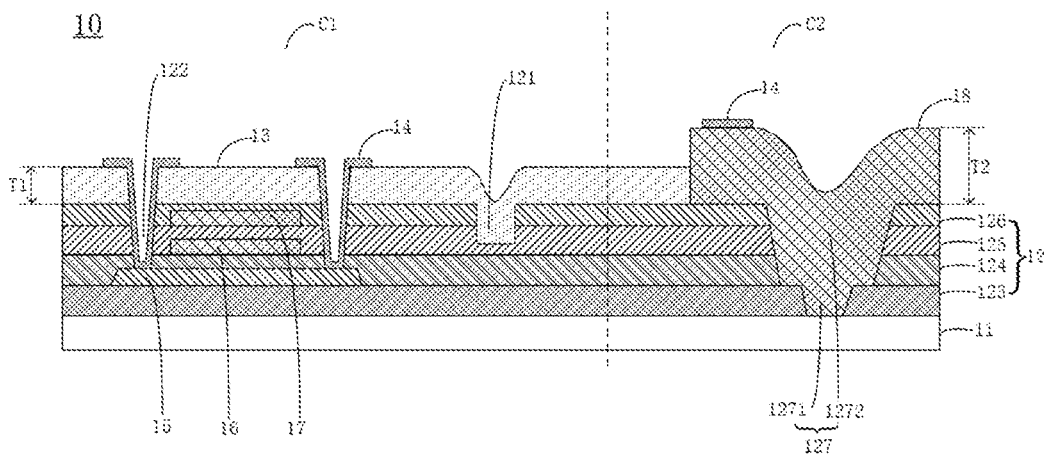
FIG. 3 is yet another schematic structural view of an array substrate provided by an embodiment of the present disclosure.

In one embodiment, as shown in FIG. 3, a substrate 11 may include a non-display region C2 disposed surrounding a display region C1. An array substrate 10 may further include a second organic layer 18 disposed on a same layer as a first organic layer 13. The second organic layer 18 is disposed on the non-display region C2. A thickness T1 of the first organic layer 13 is less than a thickness T2 of the second organic layer 18.

Specifically, keeping referring to FIG. 3, a third opening 127 may be further defined in the non-organic layer 127. The third opening 127 is defined in the non-display region C2. The second organic layer 18 fills the third opening 127. Therefore, flexibility of the non-display region C2 can be improved.

The source/drain electrode layer 14 may be a patterned source/drain electrode layer 14, the patterned source/drain electrode layer 14 covers the first organic layer 13 and the second organic layer 18. Specifically, the source/drain electrode layer 14 may include a plurality of wires spaced from each other. The wires across the display region C1 and the non-display region C2. One side of each of the wires is connected to a pixel unit (not shown) in the display region C1, and the other side of each of the wires is connected to a port of a driver (not shown) in the non-display region C2.

In some embodiments, as shown in FIG. 3, the third opening 127 may include a first opening 1271 and a second opening 1272 which are disposed in a stack and are connected to each other. The first opening 1271 and the second opening 1272 can be formed by two etching processes, thereby reducing thickness of an optically clear adhesive that needs to be coated in a single etching process, and further reducing power consumption of an exposure machine in a single etching process, which is beneficial for reducing cost.

In conventional array substrates, an organic layer, which is disposed between a source/drain electrode layer 14 and a non-organic membrane layer 13, have a same thickness. For example, a thickness of an organic layer disposed on a display region C1 and a thickness of an organic layer disposed on a display region C2 are the same, and both of their thicknesses are 1500 nm. In the conventional array substrates, because thickness of an organic layer is large, height differences of layers are large. Therefore, the source/drain electrode layer 14 on an inner wall, especially a corner, of a second opening 122 is prone to have a problem of a too-thin layer or even breakage of wires. Display images will be uncontrollable because the array substrate cannot output signals.

In the present embodiment, a thickness T2 of a second organic layer 18 may be the same as that of the conventional array substrates. However, a thickness T1 of the first organic layer 13 is less than that of the conventional array substrates. The thickness T1 of the first organic layer 13 is not greater than a depth D1 of a first opening 121. That is, compared to conventional technology, thickness of an organic layer in a display region C1 is reduced in the present disclosure, thereby reducing height difference of layers.

Specifically, a ratio of the thickness T1 of the first organic layer 13 to the thickness T2 of the second organic layer 18 ranges from 0.3 to 0.7. For example, the thickness of the first organic layer 13 may be 740 nm, and the thickness T2 of the second organic layer 18 may be 1500 nm.

In some embodiments, the thickness T2 of the second organic layer 18 may be appropriately reduced in a condition that signals output from the non-display region C2 are not be affected. For example, the thickness T2 of the second organic layer 18 may be the same as the thickness T1 of the first organic layer 13, thereby forming the first organic layer 13 and the second organic layer 18 in a single patterning process. Therefore, process of manufacturing the array substrate is simplified.

It should be noted, thickness of the entire first organic layer 13 is even. However, height difference exists between the non-organic membrane layer 12 and the first opening 121, so thicknesses of layers at the first opening 121 will be uneven after the first organic layer 13 fills the first opening 121. Consequently, in the present disclosure, the thickness T1 of the first organic layer 13 denotes a thickness of the organic layer 13 away from the first opening 121. Similarly, the above thickness T2 of the second organic layer 18 denotes a thickness of the organic layer 18 away from the third opening 127.

Compared to conventional technology, thickness of an organic layer of an array substrate provided by the present disclosure is reduced, so height differences between layers are reduced as well. Therefore, a problem of a too-thin source/drain electrode layer or even breakage of wires, which are caused by too-large height differences between layers, are reduced. Production yield is improved.

Figure 4:
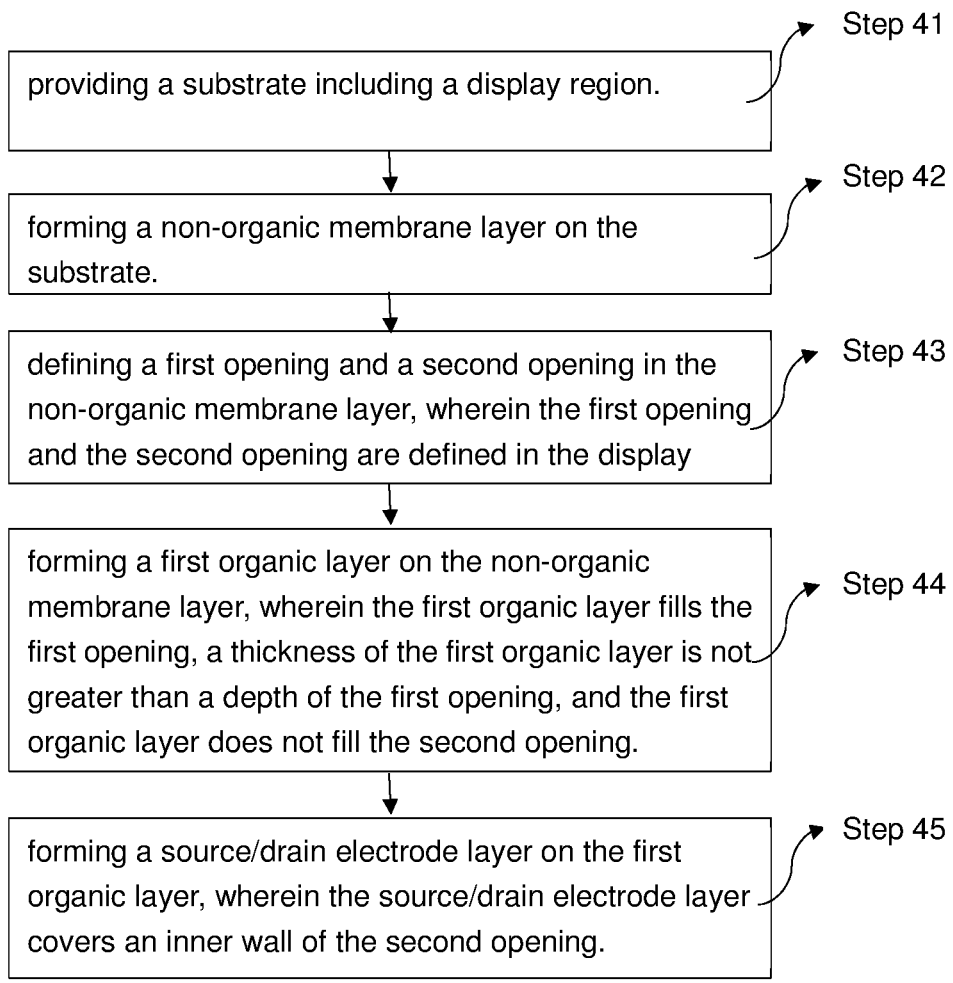
FIG. 4 is a schematic flowchart showing a method of manufacturing an array substrate provided by an embodiment of the present disclosure.

Referring to FIG. 4, FIG. 4 is a schematic flowchart showing a method of manufacturing an array substrate provided by an embodiment of the present disclosure. Specific steps of the method of manufacturing the array substrate are described as follows:

Step 41: providing a substrate including a display region. The substrate is a flexible substrate. Material of the substrate is an organic polymer and may be one of polyimide, polycarbonate, polyethylene terephthalate, or polyethersulfone.

Step 42: forming a non-organic membrane layer on the substrate. The non-organic membrane layer may include a buffer layer, a first gate insulating layer, a second gate insulating layer, and an interlayer dielectric layer which are sequentially away from the substrate. Specifically, the step 42 may include:

A sub-step A: depositing the buffer layer on the substrate. Material of the buffer layer may be SiNx, SiOx, or other appropriate material. For example, the sub-step A may specifically include a step: sequentially forming a silicon nitride layer and a silicon oxide layer on the substrate by a chemical vapor deposition process.

A sub-step B: depositing a first gate insulating layer on the buffer layer. For example, depositing a first gate insulating layer on the buffer layer by a chemical vapor deposition process. Material of the first gate insulating layer may be SiOx.

A sub-step C: depositing a second gate insulating layer on the first gate insulating layer. For example, depositing a second gate insulating layer on the first gate insulating layer by a chemical vapor deposition process. Material of the second gate insulating layer may be SiNx.

A sub-step D: depositing an interlayer dielectric layer on the second gate insulating layer. For example, depositing an interlayer dielectric layer on the second gate insulating layer by a chemical vapor deposition process. Material of the interlayer dielectric layer may be SiNx and/or SiOx.

In one embodiment, a step between the sub-step A and the sub-step B may further include:

Step (1): forming a low-temperature polysilicon layer on the buffer layer, wherein the low-temperature polysilicon layer is disposed on a display region, and the first gate insulating layer covers the low-temperature polysilicon layer. For example, the step (1) may specifically include: forming a polysilicon layer on the buffer layer in a display region by a chemical vapor deposition layer, and then performing an excimer laser annealing process on the polysilicon layer to form a corresponding low-temperature polysilicon layer.

A step between the sub-step B and the sub-step C may further include:

Step (2): forming a first metal layer on the first gate insulating layer, wherein the first metal layer is disposed on the display region, and the second gate insulating layer covers the first metal layer.

The first metal layer may be a patterned gate electrode layer including a gate electrode of the array substrate and a lower electrode of a storage capacitor of the array substrate. Specifically, the step (2) may specifically include: depositing a first metal material layer on the first gate insulating layer in the display region by a physical vapor deposition process, and patterning the first metal material layer by exposure and etching processes to obtain a patterned gate electrode layer. Material of the first metal layer may be Mo.

A step between the sub-step C and the sub-step D may further include:

Step (3): forming a second metal layer on the second gate insulating layer, wherein the second metal layer is disposed on the display region, and the interlayer dielectric layer covers the second metal layer. The second metal layer includes an upper electrode of the capacitor of the array substrate. The upper electrode and the lower electrode form the capacitor of the array substrate. Specifically, the step (3) may specifically include: Depositing a second metal material layer on the second gate insulating layer in the display region by a physical vapor deposition process, and then patterning the second metal layer by exposure and etching processes to form the second metal layer. Material of the second metal layer may be Mo.

Step 43: defining a first opening and a second opening in the non-organic membrane layer, wherein the first opening and the second opening are defined in the display region. For example, etching a predetermined position of the non-organic membrane layer on the display region to form a first opening and a second opening. The second opening extends and passes through the first gate insulating layer, the second gate insulating layer, and the interlayer dielectric layer. A projected area of the first opening on the substrate does not overlap a projected area of the low-temperature polysilicon layer on the substrate, a projected area of the first metal layer on the substrate, and a projected area of the second metal layer on the substrate. That is, a thin film transistor of the array substrate will not be harmed during process of defining the first opening on the non-organic membrane layer.

Step 44: forming a first organic layer on the non-organic membrane layer, wherein the first organic layer fills the first opening, a thickness of the first organic layer is not greater than a depth of the first opening, and the first organic layer does not fill the second opening. For example, depositing a first organic layer on the non-organic membrane layer by a chemical vapor deposition layer. Material of the first organic layer is an organic insulating material such as polyimide resin, epoxy resin, or acrylic resin.

In the present embodiment, flexibility of organic material is better than that of non-organic material. Consequently, by defining the first opening in the non-organic membrane layer and forming the first organic layer on the non-organic membrane layer to fill the first opening, bending forces applied to the display region can be reduced, and flexibility of the display region can be further improved.

The amount of the first opening may be multiple, thereby further effectively improving flexibility of the display region. Moreover, the first openings may be evenly distributed in the display region, thereby ensuring that the display panel can display uniformly.

In some embodiments, the depth of the first opening may be equal to a thickness of the non-organic membrane layer. That is, the first opening may extend through the buffer layer, the first gate insulating layer, the second gate insulating layer, and the interlayer dielectric layer. As a result, bending forces applied to the display region of the array substrate can be further reduced effectively.

Figure 5:
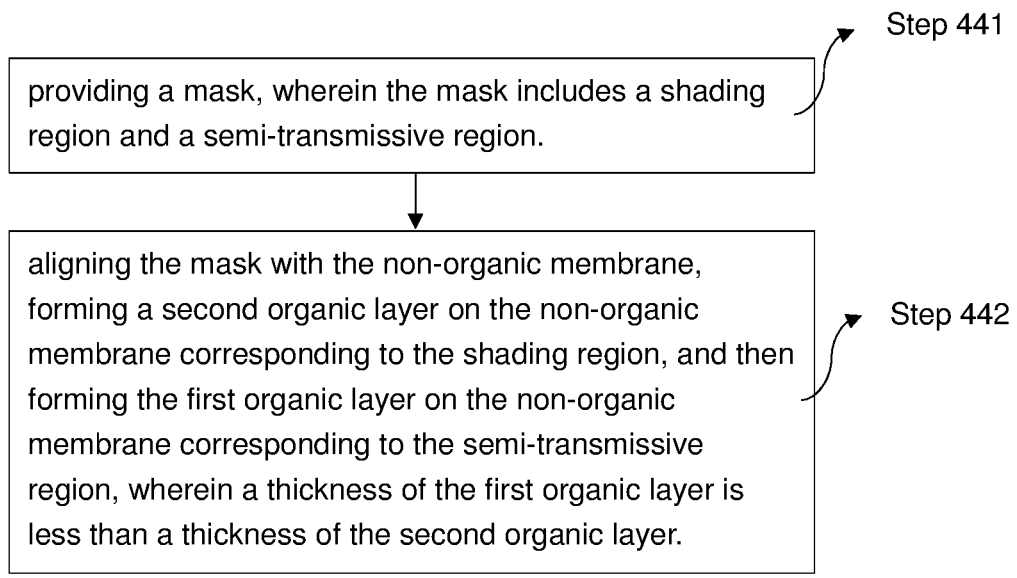
FIG. 5 is a schematic structural view of S44 in FIG. 4

In one embodiment, the substrate may further include a non-display region disposed surrounding a periphery of the display region. The array substrate may further include a second organic layer disposed on a same layer as the first organic layer. The second organic layer is disposed on the non-display region. As shown in FIG. 5, the step 44 may specifically include:

Step 441: providing a mask, wherein the mask includes a shading region and a semi-transmissive region. The mask may be a halftone mask. Specifically, the halftone mask includes a shading region and a semi-transmissive region. A part of light may be transmitted through the halftone mask, so two layers with two different thicknesses may be formed by an exposure process.

Step 442: aligning the mask with the non-organic membrane, forming a second organic layer on the non-organic membrane corresponding to the shading region, and then forming the first organic layer on the non-organic membrane corresponding to the semi-transmissive region, wherein a thickness of the first organic layer is less than a thickness of the second organic layer.

In the present embodiment, the thickness of the second organic layer may be the same as that of the conventional array substrates. However, the thickness of the first organic layer is less than that of the conventional array substrates. The thickness of the first organic layer is not greater than a depth of a first opening. That is, compared to conventional technology, thickness of an organic layer in a display region is reduced in the present disclosure, thereby reducing height difference of layers.

Specifically, a ratio of the thickness of the first organic layer to the thickness of the second organic layer ranges from 0.3 to 0.7. For example, the thickness of the first organic layer may be 740 nm, and the thickness of the second organic layer may be 1500 nm.

In some embodiments, the first organic layer and the second organic layer may be separately formed by two mask patterning processes.

Step 45: forming a source/drain electrode layer on the first organic layer, wherein the source/drain electrode layer covers an inner wall of the second opening.

Specifically, the source/drain electrode layer may be a patterned source/drain electrode layer. The step 45 may include steps: depositing a source/drain electrode material layer on an inner wall of the second opening and on the non-organic membrane layer by a physical vapor deposition process, and then patterning the source/drain electrode material layer by exposure and etching processes to obtain the patterned source/drain electrode layer. Material of the source/drain electrode layer may be metal material such as Al, Cu, or Ag. The source/drain electrode layer is connected to the low-temperature polysilicon layer by the second opening.

Compared to conventional technology, thickness of an organic layer of an array substrate manufactured according to the method provided by the present disclosure is reduced, so height differences of layers are reduced as well. Therefore, the problem of a too-thin source/drain electrode layer or even breakage of wires, which are caused by too-large height differences between layers, is reduced. As a result, production yield is improved.

Figure 6:
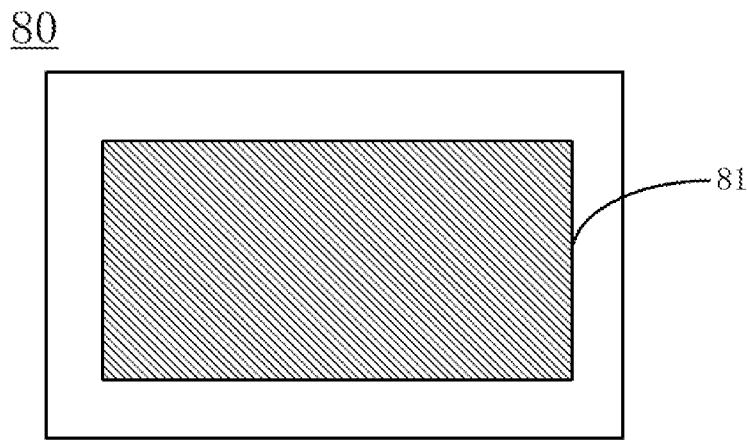
FIG. 6 is a schematic structural view of a display panel provided by an embodiment of the present disclosure.

Referring to FIG. 6, FIG. 6 is a schematic structural view of a display panel provided by an embodiment of the present disclosure. As shown in FIG. 6, a display panel 80 includes the array substrate 81 of any of the above embodiments.

The array substrate 81 includes a substrate, and a non-organic membrane layer, a first organic layer, and a source/drain electrode layer which are sequentially disposed on the substrate. The substrate includes a display region. A first opening and a second opening are defined in the non-organic membrane layer and defined in the display region. The first organic layer fills the first opening. A thickness of the first organic layer is not greater than a depth of the first opening. The first organic layer does not fill the second opening. The source/drain electrode layer covers an inner wall of the second opening.

Compared to conventional technology, thickness of an organic layer of a display panel provided by the present disclosure is reduced, so height differences of layers are reduced as well. Therefore, the problem of a too-thin source/drain electrode layer or even breakage of wires, which are caused by too-large height differences between layers, is reduced. As a result, production yield is improved.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. An array substrate, comprising:
   a substrate comprising a display region and a non-display region disposed surrounding a periphery of the display region;
   a non-organic membrane layer disposed on the substrate, wherein a first opening and a second opening are defined in the non-organic membrane layer and are defined in the display region;
   a first organic layer disposed on the non-organic membrane layer, wherein the first organic layer fills the first opening, a thickness of the first organic layer is not greater than a depth of the first opening, and the first organic layer does not fill the second opening;
   a second organic layer disposed on the non-organic membrane layer in the non-display region; and, wherein a third opening is defined in the non-organic membrane layer in the non-display region, and the second organic layer fills the third opening; and
   a source/drain electrode layer disposed on the first organic layer, wherein the source/drain electrode layer covers an inner wall of the second opening.

2. The array substrate of claim 1, wherein the non-organic membrane layer comprises a buffer layer, a first gate insulating layer, a second gate insulating layer, and an interlayer dielectric layer which are sequentially away from the substrate; and wherein the second opening extends and passes through the first gate insulating layer, the second gate insulating layer, and the interlayer dielectric layer.

3. The array substrate of claim 2, wherein the array substrate further comprises a low-temperature polysilicon layer, a first metal layer, and a second metal layer;

wherein the low-temperature polysilicon layer is disposed between the buffer layer and the first gate insulating layer, the first metal layer is disposed between the first gate insulating layer and second gate insulating layer, and the second metal layer is disposed between the second gate insulating layer and the interlayer dielectric layer; and wherein the source/drain electrode layer is connected to the low-temperature polysilicon layer by the second opening, a projected area of the first opening on the substrate does not overlap a projected area of the low-temperature polysilicon layer on the substrate, a projected area of the first metal layer on the substrate, and a projected area of the second metal layer on the substrate.

4. The array substrate of claim 2, wherein the depth of the first opening is equal to a thickness of the non-organic membrane layer.

5. The array substrate of claim 1, wherein the number of the first opening is greater than one, and the first openings are evenly distributed on the display region.

6. The array substrate of claim 1, wherein the thickness of the first organic layer is less than a thickness of the second organic layer.

7. The array substrate of claim 6, wherein a ratio of the thickness of the first organic layer to the thickness of the second organic layer ranges from 0.3 to 0.7.

8. A display panel, comprising an array substrate; wherein the array substrate comprises:

a substrate comprising a display region and a non-display region disposed surrounding a periphery of the display region;

a non-organic membrane layer disposed on the substrate, wherein a first opening and a second opening are defined in the non-organic membrane layer and are defined in the display region;

a first organic layer disposed on the non-organic membrane layer, wherein the first organic layer fills the first opening, a thickness of the first organic layer is not greater than a depth of the first opening, and the first organic layer does not fill the second opening;

a second organic layer disposed on the non-organic membrane layer in the non-display region; and, wherein a third opening is defined in the non-organic membrane layer in the non-display region, and the second organic layer fills the third opening; and a source/drain electrode layer disposed on the first organic layer, wherein the source/drain electrode layer covers an inner wall of the second opening.

9. The display panel of claim 8, wherein the non-organic membrane layer comprises a buffer layer, a first gate insulating layer, a second gate insulating layer, and an interlayer dielectric layer which are sequentially away from the substrate; and wherein the second opening extends and passes through the first gate insulating layer, the second gate insulating layer, and the interlayer dielectric layer.

10. The display panel of claim 9, wherein the array substrate further comprises a low-temperature polysilicon layer, a first metal layer, and a second metal layer;

wherein the low-temperature polysilicon layer is disposed between the buffer layer and the first gate insulating layer, the first metal layer is disposed between the first gate insulating layer and second gate insulating layer, and the second metal layer is disposed between the second gate insulating layer and the interlayer dielectric layer; and wherein the source/drain electrode layer is connected to the low-temperature polysilicon layer by the second opening, a projected area of the first opening on the substrate does not overlap a projected area of the low-temperature polysilicon layer on the substrate, a projected area of the first metal layer on the substrate, and a projected area of the second metal layer on the substrate.

11. The display panel of claim 9, wherein the depth of the first opening is equal to a thickness of the non-organic membrane layer.

12. The display panel of claim 8, wherein the number of the first opening is greater than one, and the first openings are evenly distributed on the display region.

13. The display panel of claim 8, wherein the thickness of the first organic layer is less than a thickness of the second organic layer.

14. The display panel of claim 13, wherein a ratio of the thickness of the first organic layer to the thickness of the second organic layer ranges from 0.3 to 0.7.

\* \* \* \* \*